US005990758A

United States Patent [19]

Matsubara

[11] Patent Number: 5,990,758

[45] Date of Patent: Nov. 23, 1999

[54] HIGH-FREQUENCY SIGNAL BRANCHING DEVICE

[75] Inventor: Hiroshi Matsubara, Aichi-ken, Japan

[73] Assignee: Masprodenkoh Kabushikikaisha, Japan

[21] Appl. No.: 08/860,869

[22] Filed: Jun. 20, 1997

[30] Foreign Application Priority Data

Dec. 22, 1994 [JP] Japan .................................... 6-336241

[51] Int. Cl.$^6$ ....................................................... H03H 7/48

[52] U.S. Cl. .......................... 333/100; 333/101; 333/136; 333/24 R

[58] Field of Search ..................................... 333/100, 101, 333/109, 112, 124, 125, 136, 24 R

[56] References Cited

U.S. PATENT DOCUMENTS 3,881,160 4/1975 Ross ........................................ 333/124

4,755,776 7/1988 Preschutti ................................ 333/100

5,058,198 10/1991 Rocci et al. ........................ 333/100 X

*Primary Examiner*—Paul Gensler

*Attorney, Agent, or Firm*—William A. Drucker

[57] ABSTRACT

A high-frequency signal branching device comprises a main body having an input terminal and an output terminal for connecting trunk cables on an input and an output side, respectively, and a branch body having a branch terminal for connecting a branch cable. This construction allows the number of branch terminals to be increased by replacing the branch body while keeping the main body intact. A branching circuit for branching a high-frequency signal from the trunk cable is provided in the branch body. Accordingly, the branching circuit also can be replaced by replacing the branch body.

2 Claims, 5 Drawing Sheets

HIGH-FREQUENCY SIGNAL BRANCHING DEVICE

TECHNICAL FIELD

The present invention relates to a high-frequency signal branching device, used in a high-frequency signal handling facility such as a community antenna television reception facility, for tapping a portion of a high-frequency signal being transmitted through a trunk cable and thus distributing the signal to subscribers of the community antenna reception service.

BACKGROUND ART

A prior art branching device of this type comprises a main body having an input terminal and an output terminal, each for connecting a trunk cable, and a branch body having a branch terminal for connecting a branch cable. The main body and the branch body are each provided with a pair of connecting terminals, one pair detachable from the other pair, for delivering a high-frequency signal from the main body to the branch body. The main body contains a branching element for passing the high-frequency signal input at the input terminal through to the output terminal while diverting a portion of the high-frequency signal for supply to the connecting terminals on the main body. The branch body contains a signal sendout circuit for sending the high-frequency signal input at the connecting terminals on the branch body out to the branch terminal. (Refer, for example, to Japanese Patent Unexamined Publication No. 63-209316).

With this kind of branching device, when a subscriber desires to receive a high-frequency signal, for example, a television signal, he can receive the television signal via the branch terminal and view the desired program. When the number of subscribers increases, the branch body is replaced by a branch body equipped with a larger number of branch terminals, thus increasing the number of branch terminals and allowing distribution of television signals to the increased number of subscribers. Work involved with this addition is easy since it can be accomplished by simply replacing the branch body while keeping the main body connected in the trunk cable. Furthermore, since the output of the television signal from the output terminal on the main body can be continued during the work, the work for the addition can be done without causing interruption in signal transmission to the subscribers who are receiving the television signal off the trunk cable connected on the output side.

In the above prior art high-frequency signal branching device, however, if the branch body is replaced, the branching element provided in the main body continues to be used. This means that the level of signal to be supplied to the branch body is the same as before. As a result, the level at each branch terminal drops in proportion to the increase in the number of branch terminals. This has lead to the problem that if the distance to a new subscriber, and hence the length of the branch cable to that subscriber, is long, signal loss increases while the television signal is being transmitted through the branch cable, resulting in an insufficient television signal level, and hence picture quality degradation, in the subscriber's home. Furthermore, when the number of subscribers to be added is very large, a significant loss occurs when branching the high-frequency signal into a large number of branch terminals in the branch body; this has caused the problem that the television signal level at each branch terminal is insufficient and picture quality degrades at television sets receiving television signals via these branch terminals.

It is an object of the present invention to provide a high-frequency signal branching device that can tap a high-frequency signal and output it at a branch terminal for reception when it is desired to receive the high-frequency signal.

Another object is to permit the number of branch terminals to be increased to provide for an increase in the number of subscribers to high-frequency signal reception and to ensure that the signal can be delivered via each branch terminal to each of the subscribers.

Another object is to make it easy to increase the number of branch terminals.

Another object is to provide the necessary and sufficient level of signal to every subscriber when making provision to distribute the high-frequency signal to the increased number of subscribers.

Another object is to make it possible to do the work to increase the number of branch terminals while allowing the output of the high-frequency signal from the output terminal to be continued during the work so that no interruptions are caused in the signal transmission to subscribers receiving the high-frequency signal off the trunk cable connected on the output side.

More specifically, the object is to provide a high-frequency signal branching device that can allow the output side to continue to supply the signal without causing momentary interruptions or level drops in the signal (without causing momentary signal interruptions or voltage drops) during the work whether the signal is an analog signal or a digital signal, and that can continue to supply a constant level of signal to the output side without causing variations in the level while the work to increase the number of branch terminals is in progress.

Another object is to provide a high-frequency branching device that permits creation of specifications optimum for each subscriber premises by making arrangements so that the problem of providing branch terminals in a quantity appropriate to the number of subscribers and the problem of supplying the necessary and sufficient level of signal to the branch terminals can be addressed individually when making provision to distribute the high-frequency signal to the increased number of subscribers.

More specifically, the object is to provide a high-frequency signal branching device that allows only the number of branch terminals on the branch body to be increased while keeping the branching circuit in the branch body intact and thus not changing its insertion loss, or that permits work to be done to change only the coupling loss by replacing the branching circuit in the branch body without removing the branch cables connected to the branch terminals on the branch body.

Other objects and advantages will become more apparent from the drawings and the description given hereinafter with reference to the drawings.

DISCLOSURE OF THE INVENTION

The high-frequency signal branching device of the present invention comprises a main body A having an input terminal A3 and an output terminal A4 for connecting trunk cables on an input and an output side, respectively, and a branch body B constructed separately from said main body A and having one or more than one branch terminal B25 for connecting a branch cable, wherein said main body A is provided with a first connecting terminal A5 connected to said inpout terminal A3 and a second connecting terminal A6 connected to said output terminal A4, between said input terminal A3 and said output terminal A4 is provided a signal passing circuit for passing a high-frequency signal, input at said input terminal A3, through to said output terminal A4 via a switch that is turned on when said branch body B is removed in its entirety, said branch body B includes a signal extraction section B1 for tapping and extracting a portion of the high-frequency signal input at said input terminal A3, and a signal sendout section B2, constructed separately from said signal extraction section B1 for accepting the high-frequency signal extracted by said signal extraction section B1 and for outputting the same from said branch terminals B25 provided thereon, said signal extraction section B1 is provided with first and second connecting terminals B12, B13 so constructed as to mate with said first and second connecting terminals A5, A6 respectively on said body A, said first and second connecting terminals A5, B12 and A6, B13 being made detachable to allow replacement of said signal extraction section B1 with respect to said main body A, said signal extraction section B1 is further provided with a branch side terminal B14 for conducting said high-frequency signal toward said signal sendout section B2, and furthermore, said signal extraction section B1 is provided with a branching circuit for passing the high-frequency signal, input at said first connecting terminal B12 on said signal extraction section B1, through to said second connecting terminal B13 on said signal extraction section B1 while diverting a portion of said high-frequency signal to said branch side terminal B14, said signal sendout section B2 is provided with a signal conducting distribution input terminal B24 for accepting the high-frequency signal from said signal extraction section B1 and for conducting the same to said one or more than one branch terminal B25 provided thereon, said distribution input terminal B24 being made detachable with respect to said branch side terminal B14.

The high-frequency signal branching device of the present invention comprises a main body A having an input terminal A3 and an output terminal A4 for connecting trunk cables on an input and an output side, respectively, and a branch body B having one or more than one branch terminal B25 for connecting a branch cable, wherein the main body A is provided with a first connecting terminal A5 connecting to the input terminal A3 and a second connecting terminal A6 connecting to the output terminal A4, and the branch body B is provided with first and second connecting terminals B12 and B13 for connecting respectively with the first and second connecting terminals A5 and A6 on the main body, the first and second connecting terminals B12 and B13 being made detachable from the first and second connecting terminals A5 and A6 on the main body to allow the branch body B to be replaced with respect to the main body A, the branch body including branching circuits B15 and B26 for passing a high-frequency signal, input at the first connecting terminal B12, through to the second connecting terminal B13 while diverting a portion of the high-frequency signal to the one or more than one branch terminal B25.

The present invention has the effect that when it is desired to receive a high-frequency signal, a portion of the high-frequency signal can be tapped off by the branching circuit and output from the branch terminal B25 so that the tapped signal can be used for reception.

Furthermore, when the number of subscribers increases, the attached branch body B can be replaced by a new branch body B equipped with a larger number of branch terminals B25, thereby increasing the number of branch terminals for outputting high-frequency signals. The resulting effect is that the signal can be distributed to the increased number of subscribers.

Moreover, when doing work to replace the branch body B to increase the number of branch terminals, it is only necessary to replace the branch body while keeping the main body connected in the trunk cable. This has the effect of simplifying the work.

Furthermore, when making provision to distribute the high-frequency signal to the new subscribers, the branching circuit can also be replaced by replacing the branch body B. This therefore has the effect that a high-frequency signal of sufficient level can be supplied to the new subscribers by selecting a branch body B equipped with a branching circuit having characteristics that can satisfy the required signal level at the new subscribers' premises.

Moreover, when doing the above work, in the main body A the output of the high-frequency signal from the output terminal A4 can be continued. Accordingly, the high-frequency signal can be supplied uninterruptedly to subscribers receiving the signal off the trunk cable 7 connected on the output side.

The invention has the further characteristic that when doing the work to increase the number of branch terminals B25 on the branch body B, only the signal sendout section B2 equipped with the branch terminals B25 can be replaced without disconnecting the branching circuit provided in the signal extraction section B1 of the branch body B even momentarily from the input and output terminals A3 and A4 on the main body A, that is, while keeping the branching circuit connected between the input and output terminals A3 and A4. Keeping the signal extraction section B1 connected in this way has the effect of being able to continue to supply signals of good quality, including digital signals, to the subscribers connected downstream of the output terminal A4 without causing any interruption even momentarily in the transmission of signals, and without causing variations in signal leve, while the work is in progress.

Furthermore, when doing the work to replace only the branching circuit to change the coupling loss of the branch body B without increasing the number of branch terminals B25 on the branch body B, only the signal extraction section B1 can be replaced within a very short time while keeping the signal sendout section B2 intact, without causing interruption in the signal output from the output terminal A4 and without going to the trouble of removing and then attaching again the one or more than one branch cable connected to the branch terminals B25 on the branch body B. This provides an enormous advantage since the time during which the subscribers connected downstream of the output terminal A4 are affected by the signal level variations caused during the work can be reduced to a minimum.

BEST MODE FOR CARRYING OUT THE INVENTION

Figure 1:
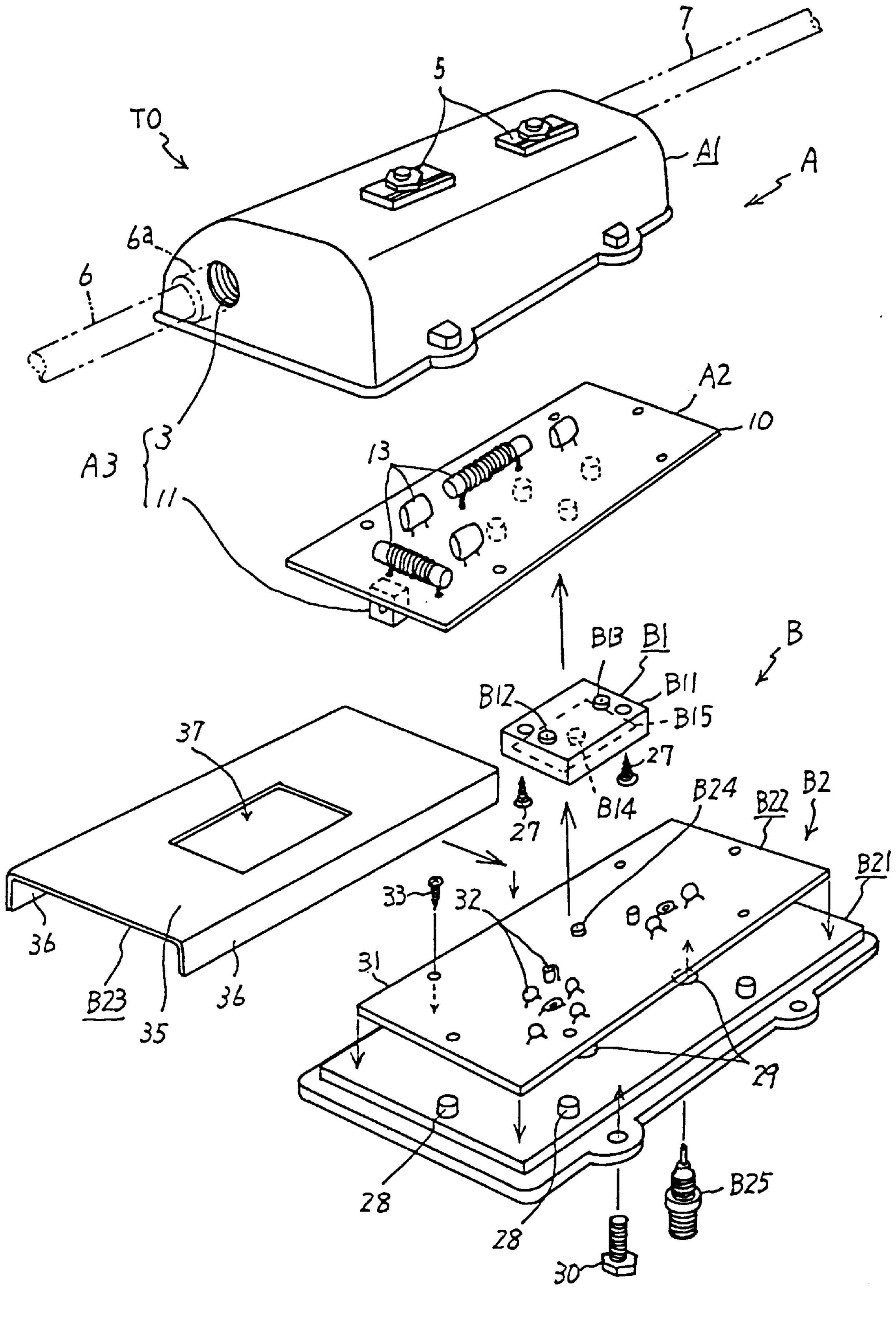
FIG. 1 is an exploded view in perspective of a high-frequency signal branching device.
Figure 2:
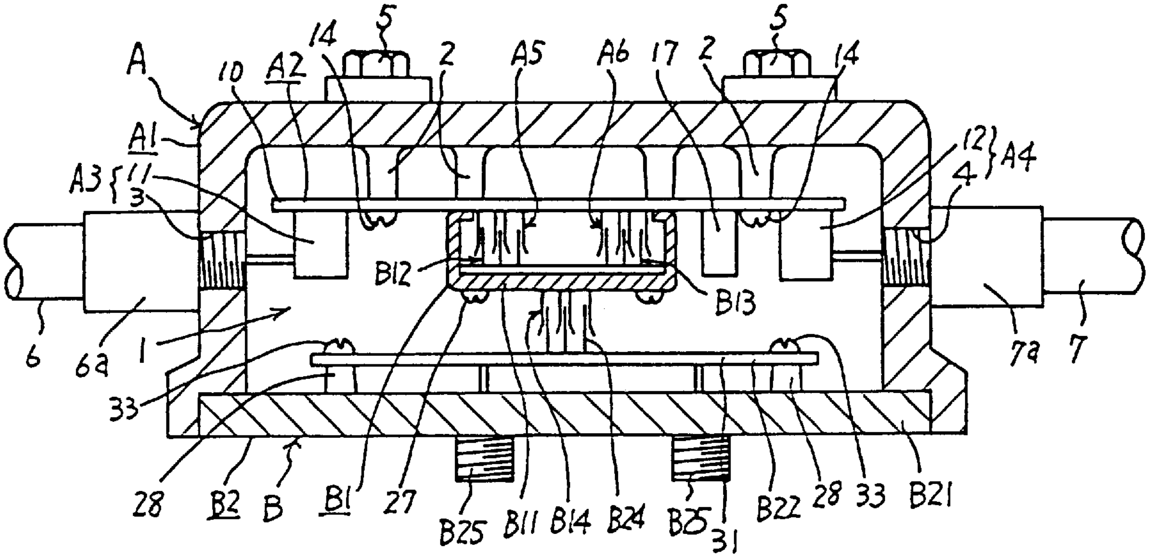
FIG. 2 is a vertical sectional view of the high-frequency signal branching device.
Figure 3:
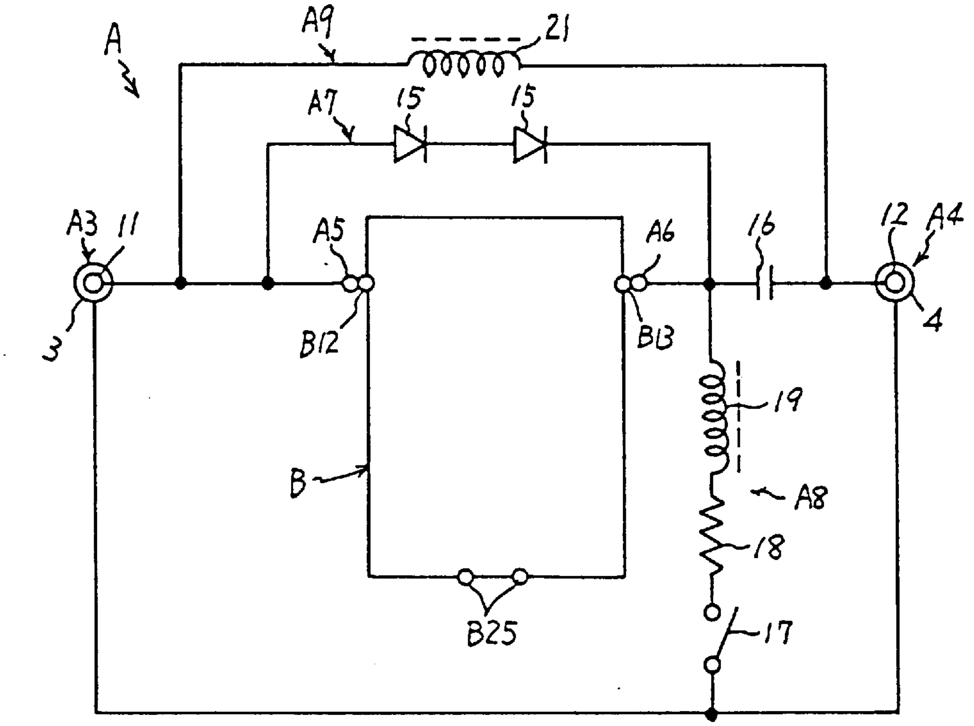
FIG. 3 is a circuit diagram of the high-frequency signal branching device.
Figure 4:
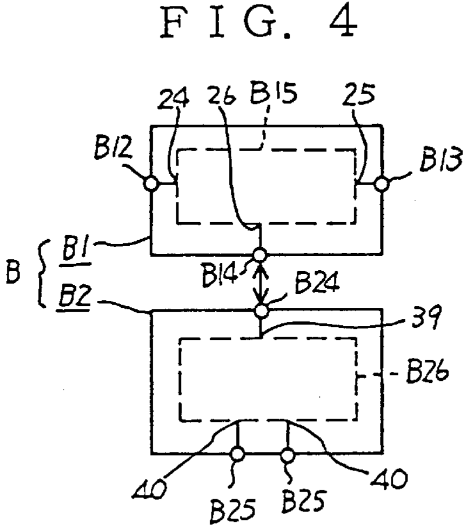
FIG. 4 is a block diagram showing one example of a branch body circuit configuration.

The present invention will now be described below with reference to the drawings illustrating embodiments thereof. In FIGS. 1 to 3, a high-frequency signal branching device TO comprises a main body A and a branch body B detachable from the main body A. The main body A consists of elements indicated by reference numerals A1 to A9. Each element will be described. A1 is a case body. A2 is a motherboard to be housed in the case body A1. A3 is an input terminal for connecting a trunk cable on the input side. A4 is an output terminal for connecting a trunk cable on the output side. A5 and A6 are first and second connecting terminals, respectively connected to the input terminal A3 and the output terminal A4, for conducting high-frequency signals from the main body A to the branch body B and from the branch body B to the main body A, respectively. A7 is a means for passing the high-frequency signal arriving at the input terminal A3 through to the output terminal A4; this means is a signal passing circuit which is connected to pass the high-frequency signal between the two terminals and is capable of being switched on and off. That is, the circuit is switched between high-frequency signal passing and blocking states. A8 is an ON/OFF means for switching the signal passing circuit A7 on and off. A9 is a current passing circuit which is connected to pass a high-frequency device operating current (for example, 60 V, 10 A) between the input terminal A3 and the output terminal A4. Each of these elements will be described below.

First, the case body A1 will be described. The case body A1 is made of a metallic material, for example, an aluminum alloy, to provide high resistance to weather in outdoor use, and to function as a grounding circuit for the high-frequency signal branching device. Each part in the case body A1 will be described. Reference numeral 1 is a space for accommodating a motherboard A2 and the branch body B, and 2 is a seat for mounting the motherboard. Reference numerals 3 and 4 are outer conductor connecting portions of the input terminal A3 and output terminal A4, respectively; here, threaded holes for accommodating fitting connectors are shown as an example. Reference numeral 5 shows fastening devices for fastening the high-frequency signal branching device to a support member, for example, a messenger wire. Reference numerals 6 and 7 are the trunk cables on the input and output sides, respectively, and 6*a* and 7*a* are the fitting connectors.

Next, each part of the motherboard A2 will be described. Reference numeral 10 is a circuit board which, as is known, includes a large number of circuit conductors such as signal conductors and ground conductors. The circuit board 10 is, for example, a printed circuit board. The ground conductors are connected to the case body A1 to electrically maintain the two members at the same potential. Reference numerals 11 and 12 are center conductor connecting portions of the input terminal A3 and output terminal A4, respectively; here, connecting devices for connecting the center conductors of the respective fitting connectors are shown as an example. Reference numeral 13 shows various circuit elements which are mounted on the board 10 to form the above-mentioned circuits A7, A8, and A9. Reference numeral 14 is a screw as an example of a fastener for mounting the circuit board 10 on the seat 2.

The first connecting terminal A5 and the second connecting terminal A6 are mounted on the circuit board 10. Each of these connecting terminals is provided with a center conductor and an outer conductor which are connected to the center conductor connecting portion and the outer conductor connecting portion of the input terminal A3 or the output terminal A4 through circuit conductors on the circuit board 10. The connecting terminals A5 and A6 are of the construction that allows other connecting terminals to be connected and disconnected by pushing and pulling, for example.

The signal passing circuit A7 consists of members indicated by reference numerals 15 and 16. Reference numeral 15 is a PIN diode shown as an example of a switching member for passing or blocking high-frequency signals, and has the property that its high-frequency resistance decreases or increases depending on the presence or absence of the application of a direct current. Reference numeral 16 is a capacitor for passing high-frequency signals handled in the high-frequency signal branching device, for example, television signals in the VHF band, with minimum loss, while blocking the passage of the high-frequency device operating current. The PIN diodes 15 and the capacitor 16 are connected between the input terminal A3 and the output terminal A4 through circuit conductors on the circuit board 10, as shown in FIG. 3.

The ON/OFF means A8 consists of members indicated by reference numerals 17 to 19. Reference numeral 17 is a switch for performing switching to pass or block the high-frequency signal. Reference numeral 18 is a current limiting resistor for limiting the current flowing to the PIN diodes 15 to within an appropriate value. Reference numeral 19 is a high-frequency signal blocking coil for preventing the high-frequency signal passing through the signal passing circuit A7 from dropping to the grounding circuit via the members 17 and 18.

Next, the current passing circuit A9 will be described. Reference numeral 21 is a coil for passing the high-frequency device operating current while blocking the passage of the high-frequency signal; the coil is connected between the input terminal A3 and the output terminal A4 through circuit conductors on the circuit board 10.

The branch body B will now be described. In the illustrated example, the branch body B comprises a branch unit B1 which is a signal extraction section for tapping and extracting a portion of the high-frequency signal, and a distribution unit B2 which is a signal sendout section for outputting the extracted high-frequency signal through the plurality of branch terminals. These units will be described below.

First, the branch unit B1 consists of elements indicated by reference numerals B11 to B15, each of which will be described. B11 is a case provided to protect the built-in branching circuit and to facilitate connection and disconnection with respect to the main body A. B12 is a first connecting terminal, paired with the terminal A5, for taking the high-frequency signal fed from the main body A. B13 is a second connecting terminal, paired with the terminal A6, for feeding the high-frequency signal from the branch body B into the main body A. The terminals B12 and B13 are both mounted on the same surface of the case B11, spaced apart from each other by a distance corresponding to the spacing between the first connecting terminal A5 and the second connecting terminal A6. The terminals B12 and B13 are of the construction that allows connection and disconnection with respect to the first and second connecting terminals A5 and A6 by pushing and pulling, for example, and are each provided with a center conductor and an outer conductor which are connected to the center conductor and outer conductor of the corresponding terminal A5 or A6. B14 is a branch side terminal which is a signal conduction terminal for conducting signals to the signal sendout section B2, and is disposed on the side of the case B11 opposite to the side thereof on which the terminals B12 and B13 are mounted. The terminal B14 is provided with a center conductor and an outer conductor, and is constructed so that it can be connected to and disconnected from another signal conducting terminal by pushing and pulling, for example. B15 is a branching element for tapping off a portion of the high-frequency signal and for supplying it to the terminal B14, and is shown as an example of the branching circuit for tapping off a portion of the high-frequency signal applied to the first connecting terminal B12. The branching circuit B15 has a known configuration, and its input end 24, output end 25, and branching end 26 are connected to the terminals B12, B13, and B14, respectively. Reference numeral 27 is a set screw shown as an example of a fixing member for fixing the branch unit B1 to the seat 2 on the case body A1 through a throughhole in the circuit board 10. The branch unit B1 of the above construction is prepared in various types with coupling losses to the branch side terminal B14 being 6 dB, 10 dB, etc.

The distribution unit B2 consists of elements indicated by reference numerals B21 to B26. That is, B21 is a base body, B22 is a tap plate board, B23 is a protective cover for the board B22, B24 is a distribution input terminal which is a signal conduction terminal for taking the tapped signal from the branch body B1, and B25 is a branch terminal for connecting a branch cable; in the illustrated example, two branch terminals B25 are provided. B26 is a distribution circuit shown as an example of a signal sendout circuit for sending the high-frequency signal, input at the terminal B24 on the branching circuit, out to the respective branch terminals B25; the example shown here has two distribution outputs corresponding to the number of branch terminals B25. The distribution unit B2 is prepared in various types with different numbers of branch terminals B25 other than the above two-output type, for example, 1, 4, 8, or 16 output terminals. When the number of branch terminals B25 is 1, the signal sendout circuit B26 is merely a connecting line connecting between the terminals B24 and B25. When the number of branch terminal B25 is 4, 8, or 16, for example, a distribution circuit with distribution outputs equal in number to the branch terminals is used as the signal sendout circuit B26. Each of the elements B21 to B26 will be described below.

The base body B21 is for mounting the tap plate board B22 and the branch terminals B25. The base body B21 also serves as a cover for closing the opening of the case body A1, and is made of an aluminum alloy as the case body A1 is. Reference numeral 28 is a seat for the board, and 29 is a throughhole for mounting the branch terminal B25. As is well known, a water-proof packing is interposed between a periphery of the case body A1 and a periphery of the base body B21 which are overlaid one on top of the other. Reference numeral 30 is a bolt shown as an example of a joining means for joining the main body A and the branch body B together by fixing the base body B21 to the case body A1.

Next, the tap plate board B22 will be described. Reference numeral 31 is a circuit board which, as is known, includes a large number of circuit conductors such as signal conductors and ground conductors. The circuit board is, for example, a printed circuit board. The ground conductors are connected to the base body B21 to electrically maintain the two members at the same potential. Reference numeral 32 shows various circuit elements, which are mounted on the board 31 to form the distribution circuit B26. Reference numeral 33 is a screw shown as an example of a fastener for mounting the circuit board 31 on the seat 28.

The protective cover B23 is made, for example, of a synthetic resin material, and is used to protect the large number of circuit elements 32 mounted on the board B22. Reference numeral 35 is a cover portion for covering the upper surface of the board B22. Reference numeral 36 is a member for fixing the protective cover B23 to the board B22, and shows a fitting piece that fits onto an edge portion of the circuit board 31. Reference numeral 37 is a hole for positioning the branch unit B1 in place.

The distribution input terminal B24 is mounted on the circuit board 31 at a position corresponding to the branch side terminal B14. The terminal B24 is so constructed as to be connected to and disconnected from the branch side terminal B14 by pushing and pulling, for example, and is provided with a center conductor and an outer conductor which are connected to the center conductor and outer conductor of the terminal B14.

Next, as an example of the branch terminal B25, an F-type connector is shown, whose outer conductor is fitted into the throughhole 29 in the base body B21 and whose center conductor is connected to the circuit board 31.

The distribution circuit B26 has a known configuration, and consists of the circuit board 31 and the large number of circuit elements 32 mounted on it. Reference numerals 39 and 40 respectively indicate an input end and a distribution output end which are respectively connected to the distribution input terminal B24 and the branch terminal B25 through circuit conductors on the circuit board 31.

Figure 5:
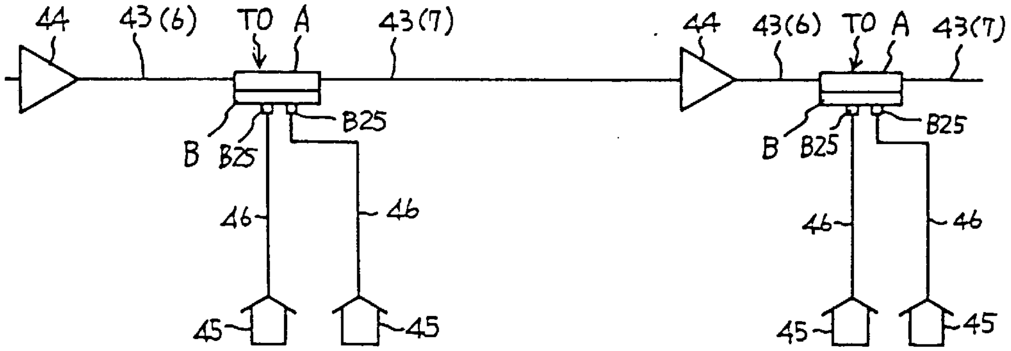
FIG. 5 is a diagram showing a community antenna reception facility.

Next, a description will be given of FIG. 5 which shows the high-frequency signal branching device TO in an operating condition. This figure shows a community antenna television reception facility. Reference numeral 43 is a trunk cable for which a coaxial cable is usually used. The previously described input side and output side trunk cables 6 and 7 refer to the sections of the trunk cable 43 which lie on the input side and output side of the branching device TO, respectively. Reference numeral 44 is a trunk amplifier. Reference numeral 45 is terminal equipment in a home of a subscriber to the community antenna reception service. Reference numeral 46 is a branch cable.

In the above configuration, a high-frequency device operating current is sent through the trunk cable 43 from a power inserting device provided outside the figure, for example, to the left of the figure. Each trunk amplifier 44 is driven by this current. In the high-frequency signal branching device TO, the current enters the input terminal A3 through the trunk cable 6, and passes through the current passing circuit A9 to the output terminal A4 from which the current is sent out on the trunk cable 7.

In the above condition, high-frequency signals, for example, television signals, transmitted through the trunk cable 43 from the previous stage, are amplified by the trunk amplifier 44 and transported to the next stage sequentially. The operation at the branching device TO is as follows. In the usual operating condition, the switch 17 is open and hence the PIN diodes 15 exhibit a large high-frequency resistance, so that the signal passing circuit A7 is in the high-frequency signal blocking state. As a result, the television signal entering the input terminal A3 through the trunk cable 6 is fed via the terminals A5 and B12 into the branching circuit B15 and then passed through the terminals B13 and A6 and the capacitor 16 to the output terminal A4 from which the signal is sent out on the trunk cable 7. In the branching circuit B15, a portion of the television signal is tapped off and is fed via the terminals B14 and B24 into the distribution circuit B26 for distribution to each branch terminal B25 for output. The output signal is delivered through the branch cable 46 to the terminal equipment 45. If an example of signal levels and other values at various portions is given, the level at the position of the input terminal A3 on the branching device TO is 95 dB, the coupling loss of the branch unit B1 is 20 dB, the distribution loss of the distribution unit B2 is 4 dB, the length of the branch cable 46 is 10 m, the loss through that length is 1 dB, and the level at the terminal equipment 45 is 70 dB. This level of 70 dB is the level that can provide proper television signal reception, that is, that can ensure proper image and voice reception.

Figure 6:
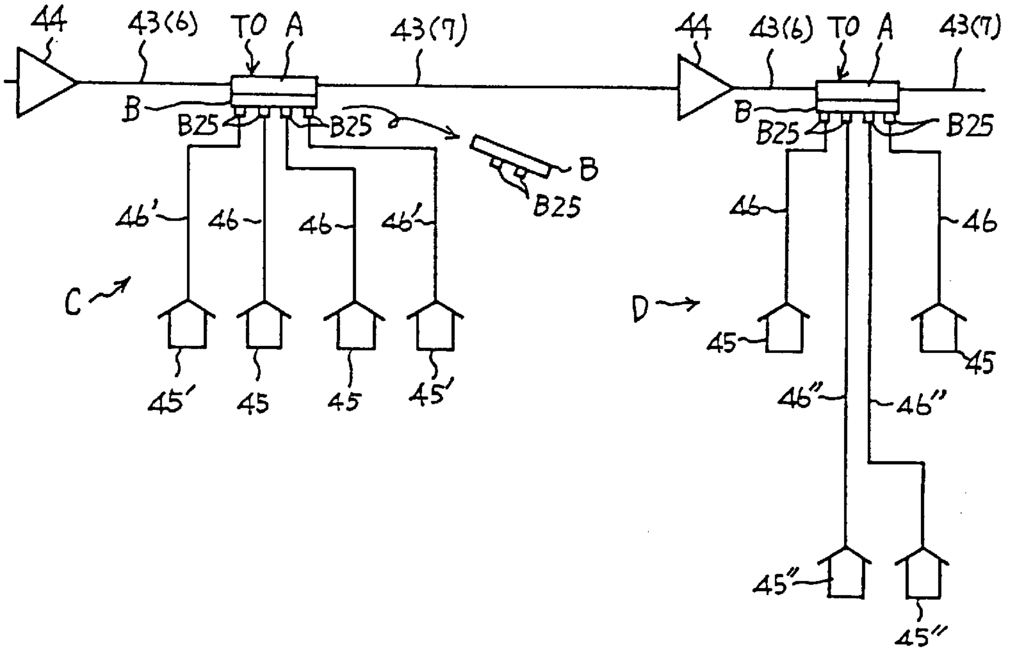
FIG. 6 is a diagram showing the community antenna reception facility after new subscribers are added.

Next, a description will be given of FIG. 6 showing a case in which there occurs an increase in the number of subscribers in the above-described community antenna reception system. In an example shown in the figure, two new subscribers 45' are added in area C, both relatively near the branching device TO, for example, at a distance of about 10 m in the length of the branch cable 46'. In area D, two new subscribers 45" are added, both far from the branching device TO, for example, at a distance of about 100 m in the length of the branch cable 46". In this case, in area C the branch body B with two branch terminals B25 is removed, and in place of it, a branch body B with four branch terminals B25 is installed. The same is done in area D.

The procedure for the above work will be described below. First, the required coupling loss of the branch unit B1 is computed in advance by calculating levels at actual premises in each area. For example, the coupling loss allowable for the branch unit B1 is computed from the high-frequency signal level occurring at the first connecting terminal A5, the necessary level at the branch terminal B25, and the loss of the new distribution unit B2 used. Next, on the day of the work, the branch unit B1 that meets the thus computed coupling loss requirement and the distribution unit B2 with four branch terminals B25 are brought to the premises in each of the areas C and D. On the premises in area C, the branch cable 46 is disconnected from each branch terminal B25 in the condition of FIG. 5. Next, the branch body B is removed from the main body A while keeping the main body A intact. More specifically, the bolt 30 is removed and the base body B21 is pulled downward with respect to the case body A1. With this action, the terminal B24 is disconnected from the terminal B14, and the distribution unit B2 is thus removed. In this case, since the branch unit B1 is fixed to the case body Al with the screw 27, the branch unit B1 is prevented from being accidentally removed before performing the signal passing operation hereinafter described, thus preventing an accident leading to interruption in the transmission of television signals to the downstream stages along the trunk line.

Next, the switch 17 is turned on. This causes a portion of the power supply current from the input terminal A3 to flow through a circuit made up of the PIN diodes 15, the coil 19, the resistor 18, and the switch 17, and as a result, the high-frequency resistance of the PIN diodes 15 decreases. That is, the signal passing circuit A7 is, put in a conducting state (ON state) in terms of high frequencies. When this state is reached, the television signal arriving at the input terminal A3 from the trunk cable 6 is passed through the signal passing circuit A7 and sent to the output terminal A4 from which the signal is sent out on the trunk cable 7. Accordingly, when the branch unit B1 is removed as described below, the transmission of television signals to the downstream stages can be continued without interruption.

When the signal passing state is entered as described above, the screw 27 is removed and the branch unit B1 is pulled downward. With this action, the terminals B12 and B13 are disconnected from the terminals A5 and A6, and the branch unit B1 is thus removed. Next, the branch unit B1 having the coupling loss (for example, 16 dB) computed for the area C is attached in place of the removed branch unit B1. Next, the switch 17 is turned off. This places the signal passing circuit A7 into a high frequency nonconducting state (OFF state), so that the television signal arriving at the input terminal A3 is passed through the new branch unit B1 and sent to the output terminal A4 for output. Next, the new distribution unit B2 with four branch terminals B25 is mounted by reversing the above removal procedure. Then, the branch cables 46 and 46' leading to the subscribers' homes 45 and 45' are connected to the branch terminals B25, thus completing the work. During the above work, the power supply current can be continuously sent through the current passing circuit A9, thus preventing the downstream trunk amplifiers 44 from becoming inoperative accidentally.

In doing the work to increease the number of branch terminals B25, if the signal level at the premises of the subscribers 45' is maintained within the specified value for that area (for example, 70 to 85 dB), there is no need to replace the branch unit B1. On the other hand, if the level at any premises downstream of the areas C and D is affected as a result of the above work, only the branch unit B1 in the branch body for the affected area should be replaced to maintain the required level.

The work at the premises in area D is the same as the work done at the premises in area C, except that the branch unit B1 with the coupling loss (for example, 4 dB) computed for area D is used.

At the branching device TO in each of the areas C and D where the branch body B has been replaced as described above, transmission of the power supply current and transmission and branching of the television signal are performed in the same manner as previously described. The relationships among signal levels at various portions in the above case are as follows. First, in area C, the level at the input terminal A3 of the branching device TO is 95 dB, the coupling loss of the branch unit B1 is 16 dB, the distribution loss of the distribution unit B2 is 8 dB, the length of the branch cable 46, 46' is 10 m, the loss through that length is 1 dB, and the level at the terminal equipment 45, 45' is 70 dB which is sufficient for proper television signal reception. In area D, the level at the input terminal A3 of the branching device TO is 92 dB, the coupling loss of the branch unit B1 is 4 dB, the distribution loss of the distribution unit B2 is 8 dB, the length of the branch cable 46 is 10 m, the loss through that length is 1 dB, the level at the terminal equipment 45 is 79 dB, the length of the branch cable 46" is 100 m, the loss through that length is 10 dB, and the level at the terminal equipment 45" is 70 dB which is sufficient for proper television signal reception.

Figure 7:
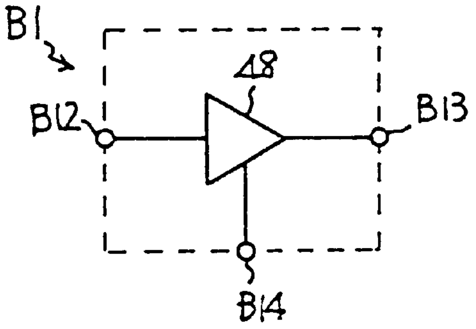
FIG. 7 is a block diagram showing a different example of a branch unit.

Next, FIG. 7 shows a different example of the branching element provided in the branch unit; that is, in the example shown, a branch amplifying circuit 48 is provided as the branching element. Parts functionally identical or equivalent to those shown in the previous drawing, and for which it is considered that the same description applies, are designated by the same reference numerals as those in the previous drawing, and the description of such parts will not be repeated here. (In the subsequent drawings also, the same reference numerals are appended for the same reason, and repetitive description is omitted.)

Figure 8A:
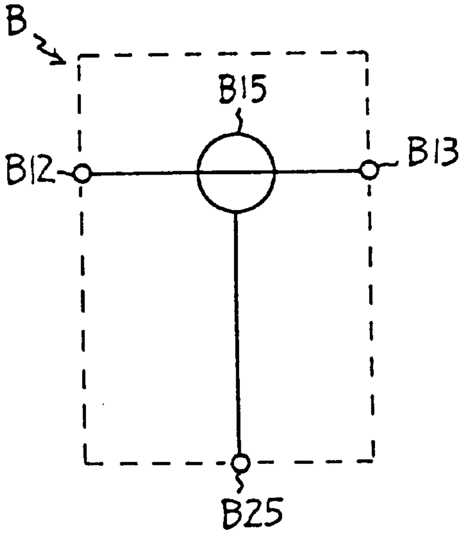
FIGS. 8A and 8B are diagrams each showing a different example of a branch body.
Figure 8B:
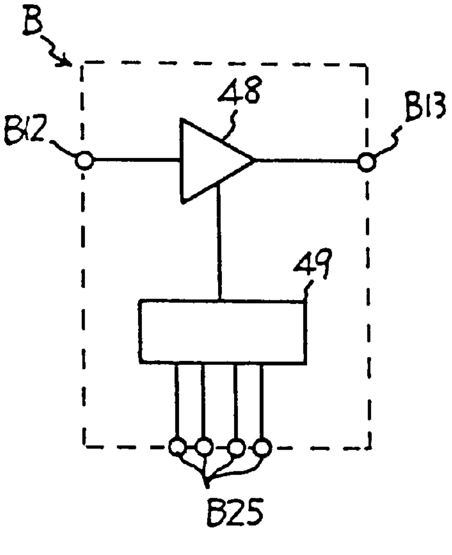

FIGS. 8A and 8B show such examples. FIG. 8A shows an example in which one branch terminal B25 is provided and the branching circuit is comprised only of a branching circuit B15, and in which a tapped signal sent from the circuit B15 is output from the branch terminal B25. More than one branch terminal B25 may be provided. FIG. 8B shows an example in which four branch terminals B25 are provided and the branching circuit is comprised of a branch amplifying circuit 45 and a 4-output distribution circuit 49, and in which the signal from the branch amplifying circuit 48 is divided by the 4-output distribution circuit 49 into four outputs which are distributed to the four branch terminals B25.

Figure 9:
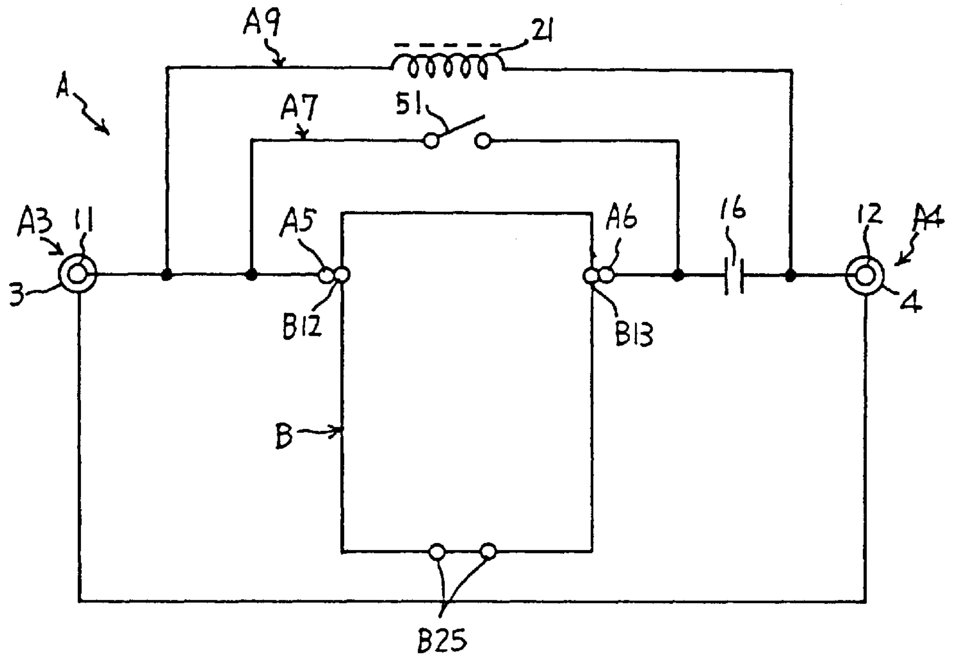
FIG. 9 is a circuit diagram showing a different example of a signal passing circuit.

Next, FIG. 9 shows a different example of the switching member for passing or blocking the high-frequency signal in the signal passing circuit A7; that is, in the example shown, a mechanically operating high-frequency switch, for example, a coaxial switch 51, is used as the switching member. In the case of this example, a moving part of the switch 51 constitutes the ON/OFF means for performing the ON/OFF operation of the switch 51.

Figure 10:
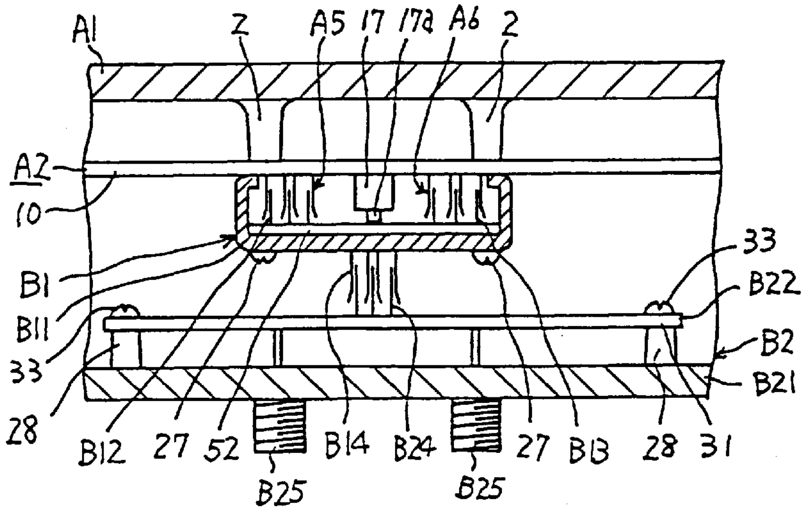
FIG. 10 is a vertical sectional view of a portion showing a different example of a switch operating means.

Next, FIG. 10 shows an example in which the switch 17 shown in FIGS. 2 and 3 is automatically turned on and off when the branch unit B1 is removed and attached. In the case of this example, the switch 17 is mounted on the circuit board 10 at a position over which the branch unit B1 is placed. A moving part 17*a* of the switch 17 is operated by a circuit board 52 built into the branch unit B1.

To prevent interruption in the television signal transmission along the trunk line, the ON/OFF relationship of the switch 17 is set as follows. That is, when the branch unit B1 is attached to the main body A, and the pair of the first connecting terminals A5 and B12 and the pair of the second connecting terminals A6 and B13 are both in the connected condition, the switch 17 is OFF with its moving part 17*a* pressed by the circuit board 52. When the branch unit B1 is pulled for removal, the pressing of the moving part 17*a* by the circuit board 52 is released, and the switch 17 is now ON. As a result, the signal passing circuit is put in a high frequency conducting state. Thereafter, when the branch unit B1 is separated from the main body A, the pair of the first connecting terminals A5 and B12 and the pair of the second connecting terminals A6 and B13 are both disconnected. At this time, the switch 17 remains ON, and the signal passing circuit A7 is held in the conducting state.

What is claimed is:

1. A high-frequency signal branching device comprising a main body having an input terminal and an output terminal for connecting trunk cables on an input and an output side, respectively, and a branch body constructed separately from said main body and having one or more than one branch terminal for connecting a branch cable, wherein (a) said main body is provided with a first connecting terminal connected to said input terminal and a second connecting terminal connected to said output terminal;

(b) between said input terminal and said output terminal is provided a signal passing circuit for passing a high-frequency signal, input at said input terminal, through to said output terminal via a switch that is turned on when said branch body is removed in its entirety;

(c) said branch body includes a signal extraction section for tapping and extracting a portion of the high-frequency signal input at said input terminal, and a signal sendout section, constructed separately from said signal extraction section, for accepting the high-frequency signal extracted by said signal extraction section and for outputting the same from said one or more than one branch terminal provided thereon;

(d) said signal extraction section is provided with first and second connecting terminals so constructed as to mate with said first and second connecting terminals respectively on said body, said first and second connecting terminals being made detachable to allow replacement of said signal extraction section with respect to said main body;

(e) said signal extraction section is further provided with a branch side terminal for conducting said high-frequency signal toward said signal sendout section, and furthermore, said signal extraction section is provided with a branching circuit for passing the high-frequency signal, input at said first connecting terminal on said signal extraction section, through to said second connecting terminal on said signal extraction section while diverting a portion of said high-frequency signal to said branch side terminal;

(f) said signal sendout section is provided with a signal conducting distribution input terminal for accepting the high-frequency signal from said signal extraction section and for conducting the same to said one or more than one branch terminal provided thereon, said distribution input terminal being made detachable with respect to said branch side terminal.

2. A high-frequency signal branching device comprising a main body having an input terminal and an output terminal for connecting trunk cables on an input and an output side, respectively, and a branch body constructed separately from said main body and having one or more than one branch terminal for connecting a branch cable, wherein (a) said main body is provided with a first connecting terminal connected to said input terminal and a second connecting terminal connected to said output terminal;

(b) said branch body includes a signal extraction section for tapping and extracting a portion of the high-frequency signal input at said input terminal, and a signal sendout section, constructed separately from said signal extraction section, for accepting the high-frequency signal extracted by said signal extraction section and for outputting the same from said branch terminals provided thereon;

(c) said signal extraction section is provided with first and second connecting terminals so constructed as to mate with said first and second connecting terminals respectively on said body, said first and second connecting terminals being made detachable to allow replacement of said signal extraction section with respect to said main body;

(d) said signal extraction section is further provided with a branch side terminal for conducting said high-frequency signal toward said signal sendout section, and furthermore, said signal extraction section is provided with a branching circuit for passing the high-frequency signal, input at said first connecting terminal on said signal extraction section, through to said second connecting terminal on said signal extraction section while diverting a portion of said high-frequency signal to said branch side terminal;

(e) said signal sendout section is provided with a signal conducting distribution input terminal for accepting the high-frequency signal from said signal extraction section and for conducting the same to said one or more than one branch terminal provided thereon, said distribution input terminal being made detachable with respect to said branch side terminal, and (f) between said input terminal and said output terminal in said body, there is provided a signal passing circuit incorporating a switch which is turned on before said first and second connecting terminals on said signal extraction section are separated from said first and second connecting terminals on said main body during the process of removing said signal extraction section, in order to supply the high-frequency signal, input at said input terminal, to said output terminal before said first and second connecting terminals on said signal extraction section are disengaged from said first and second connecting terminals on said main body.

* * * * *